US010377656B2

(12) United States Patent
Dannoux et al.

(10) Patent No.: US 10,377,656 B2
(45) Date of Patent: Aug. 13, 2019

(54) SHAPED GLASS ARTICLES AND METHODS FOR FORMING THE SAME

(71) Applicant: CORNING INCORPORATED, Corning, NY (US)

(72) Inventors: Thierry Luc Alain Dannoux, Avon (FR); Vladislav Yuryevich Golyatin, Avon (FR); John Richard Ridge, Hammondsport, NY (US); Ljerka Ukrainczyk, Painted Post, NY (US); Butchi Reddy Vaddi, Painted Post, NY (US); Natesan Venkataraman, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/309,068

(22) PCT Filed: May 7, 2015

(86) PCT No.: PCT/US2015/029681
§ 371 (c)(1),
(2) Date: Nov. 4, 2016

(87) PCT Pub. No.: WO2015/171889
PCT Pub. Date: Nov. 12, 2015

(65) Prior Publication Data
US 2017/0121209 A1    May 4, 2017

Related U.S. Application Data

(60) Provisional application No. 61/989,712, filed on May 7, 2014.

(51) Int. Cl.
*B32B 1/00* (2006.01)
*C03B 23/023* (2006.01)
(Continued)

(52) U.S. Cl.
CPC ............ *C03B 23/023* (2013.01); *B32B 17/06* (2013.01); *C03B 17/02* (2013.01); *C03B 17/064* (2013.01);
(Continued)

(58) Field of Classification Search
CPC ....... B32B 17/06; B32B 17/00; C03B 23/023; C03B 23/0066; C03B 23/203; C03B 23/03
(Continued)

(56) References Cited

U.S. PATENT DOCUMENTS 3,737,294 A    6/1973    Dumbaugh et al.
3,746,526 A    7/1973    Giffon
(Continued)

FOREIGN PATENT DOCUMENTS

CN    101568495 A    10/2009
GB    2078169    1/1982
(Continued)

OTHER PUBLICATIONS

Gy, "Ion exchange for glass strengthening", Mar. 2008, Materials Science and Engineering B, vol. 149, Issue 2, pp. 159-165.*
(Continued)

*Primary Examiner* — Maria V Ewald
*Assistant Examiner* — Zachary M Davis
(74) *Attorney, Agent, or Firm* — Svetlana Z. Short; Michael A. Hood

(57) ABSTRACT

A method includes contacting a second layer of a glass sheet with a forming surface to form a shaped glass article. The glass sheet includes a first layer adjacent to the second layer. The first layer includes a first glass composition. The second layer includes a second glass composition. An effective viscosity of the glass sheet during the contacting step is less than a viscosity of the second layer of the glass sheet during
(Continued)

the contacting step. A shaped glass article includes a first layer including a first glass composition and a second layer including a second glass composition. A softening point of the first glass composition is less than a softening point of the second glass composition. An effective $10^{8.2}$ P temperature of the glass article is at most about 900° C.

10 Claims, 16 Drawing Sheets

(51) Int. Cl.
  B32B 17/06  (2006.01)
  H05K 5/06  (2006.01)
  C03B 17/02  (2006.01)
  C03B 17/06  (2006.01)
  C03B 23/035  (2006.01)
  C03C 21/00  (2006.01)

(52) U.S. Cl.
  CPC ........ *C03B 23/0357* (2013.01); *C03C 21/002* (2013.01); *H05K 5/066* (2013.01); *Y02P 40/57* (2015.11)

(58) Field of Classification Search
  USPC .................................................. 65/106, 107
  See application file for complete search history.

(56) References Cited

U.S. PATENT DOCUMENTS

| | | |
|---|---|---|
| 3,849,097 A | 11/1974 | Giffen et al. |
| 3,931,438 A | 1/1976 | Beall |
| 4,102,664 A | 7/1978 | Dumbaugh, Jr. |
| 4,214,886 A | 7/1980 | Shay et al. |
| 4,381,932 A | 5/1983 | Olsen et al. |
| 4,457,771 A | 7/1984 | Ambrogi |
| 4,735,855 A | 4/1988 | Wofford et al. |
| 4,880,453 A | 11/1989 | Coppola et al. |
| 5,100,452 A | 3/1992 | Dumbaugh, Jr. |
| 5,342,426 A | 8/1994 | Dumbaugh |
| 5,559,060 A | 9/1996 | Dumbaugh |
| 7,201,965 B2 | 1/2007 | Gulati |
| 7,514,149 B2 | 4/2009 | Bocko et al. |
| 7,681,414 B2 | 3/2010 | Pitbladdo |
| 8,007,913 B2 | 8/2011 | Coppola |
| 8,211,505 B2 | 7/2012 | Bocko et al. |
| 8,393,177 B2 | 3/2013 | Boratav et al. |
| 2006/0127679 A1 | 6/2006 | Gulatti |
| 2008/0241603 A1 | 10/2008 | Isono |
| 2009/0270242 A1* | 10/2009 | Yanase .................... C03C 3/091 501/67 |
| 2011/0200805 A1* | 8/2011 | Tomamoto ............ C03B 23/037 428/213 |
| 2011/0318555 A1 | 12/2011 | Bookbinder et al. |
| 2012/0114901 A1 | 5/2012 | Uraji et al. |
| 2013/0015180 A1 | 1/2013 | Godard et al. |
| 2013/0086948 A1* | 4/2013 | Bisson ................ C03B 23/0258 65/106 |
| 2013/0125588 A1 | 5/2013 | Kladias et al. |
| 2014/0065374 A1 | 3/2014 | Tsuchiya et al. |
| 2014/0141217 A1 | 5/2014 | Gulati et al. |
| 2014/0162029 A1 | 6/2014 | Takeuchi et al. |
| 2015/0210583 A1 | 7/2015 | Amosov et al. |

FOREIGN PATENT DOCUMENTS

| | | | |
|---|---|---|---|
| JP | 2007076039 A | 3/2007 | |
| JP | 2010285341 A | 12/2010 | |
| JP | 2011162413 A | 8/2011 | |
| WO | 2012118612 | 7/2012 | |
| WO | WO-2012137742 A1 * | 10/2012 | ......... C03B 23/0252 |
| WO | WO-2013016157 A1 * | 1/2013 | ............. C03C 3/091 |
| WO | 2014015840 | 1/2014 | |
| WO | 2015138660 | 9/2015 | |

OTHER PUBLICATIONS

Notification of Transmittal of The International Search Report and Written Opinion of the International Searching Authority, or the Declaration, dated Jul. 5, 2014, pp. 1-8, International Application No. PCT/US2015/029681 European Patent Office, The Netherlands.
English Translation of JP2016566674 Office Action Issued Aug. 28, 2018; 5 pages; Japanese Patent Office.
English Translation of CN201580036650.4 Office Action dated Oct. 24, 2018; 15 pages; Chinese Patent Office.

\* cited by examiner

SHAPED GLASS ARTICLES AND METHODS FOR FORMING THE SAME

This application claims the benefit of priority under 35 U.S.C. § 371 of International Application No. PCT/US15/29681 filed on May 7, 2015, which claims the benefit of priority to U.S. Application No. 61/989,712 filed on May 7, 2014 the content of each of which is incorporated herein by reference in its entirety.

BACKGROUND

1. Field

This disclosure relates to glass articles, and more particularly to laminated glass articles comprising a plurality of glass layers and methods for forming the same.

2. Technical Background

A glass sheet can be molded to form a shaped glass article having a non-planar or 3-dimensional shape. Typically, a glass sheet is heated to its softening point and then deformed to conform to the surface of a solid mold.

SUMMARY

Disclosed herein are shaped glass articles and methods for forming the same.

Disclosed herein is a method comprising contacting a second layer of a glass sheet with a forming surface to form a shaped glass article. The glass sheet comprises a first layer adjacent to the second layer. The first layer comprises a first glass composition. The second layer comprises a second glass composition. An effective viscosity of the glass sheet during the contacting step is less than a viscosity of the second layer during the contacting step.

Also disclosed herein is a shaped glass article comprising a first layer comprising a first glass composition and a second layer comprising a second glass composition. A softening point of the first glass composition is less than a softening point of the second glass composition. An effective $10^{8.2}$ P temperature of the glass article is at most about 900° C. A viscosity of the second glass composition is at least about $10^{8.3}$ P at the effective $10^{8.2}$ P temperature of the glass article.

Also disclosed herein is a shaped glass article comprising a first layer comprising a first glass composition and a second layer comprising a second glass composition. A surface roughness of the shaped glass article is at most about 1 nm. A waviness of the shaped glass article is at most about 50 nm.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Figure 1:
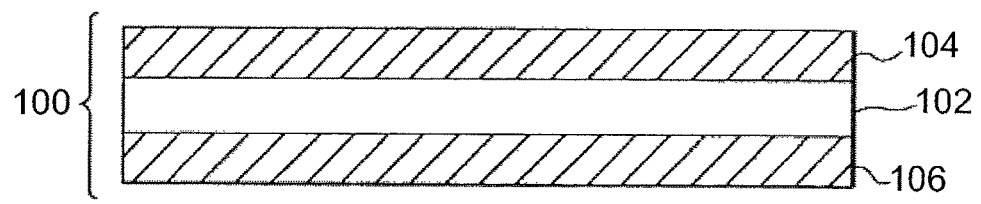
FIG. 1 is a cross-sectional view of one exemplary embodiment of a glass article.

Reference will now be made in detail to exemplary embodiments which are illustrated in the accompanying drawings. Whenever possible, the same reference numerals will be used throughout the drawings to refer to the same or like parts. The components in the drawings are not necessarily to scale, emphasis instead being placed upon illustrating the principles of the exemplary embodiments.

As used herein, the term "average coefficient of thermal expansion" refers to the average coefficient of thermal expansion of a given material or layer between 0° C. and 300° C. As used herein, the term "coefficient of thermal expansion" refers to the average coefficient of thermal expansion unless otherwise indicated.

As used herein, the term "softening point" of a glass composition refers to the temperature at which the viscosity of the glass composition is about $10^{7.6}$ Poise (P).

As used herein, the term "annealing point" of a glass composition refers to the temperature at which the viscosity of the glass composition is about $10^{13.2}$ Poise (P).

As used herein, the term "strain point" of a glass composition refers to the temperature at which the viscosity of the glass composition is about $10^{14.7}$ Poise (P).

As used herein, the term "$10^{8.2}$ P temperature" of a glass article, glass layer, or glass composition refers to the temperature at which the viscosity of the glass article, glass layer, or glass composition is about $10^{8.2}$ P.

In various embodiments, a glass sheet is contacted with a forming surface to form a shaped glass article. The glass sheet comprises at least a first layer and a second layer. For example, the first layer comprises a core layer, and the second layer comprises one or more cladding layers adjacent to the core layer. The first layer and/or the second layer are glass layers comprising a glass, a glass-ceramic, or a combination thereof. For example, the first layer and/or the second layer are transparent glass layers. In some embodiments, during contacting of the glass sheet with the forming surface, a viscosity of the first layer is less than a viscosity of the second layer in contact with the forming surface. For example, an effective viscosity of the glass sheet is less than a contact viscosity of the glass sheet in contact with the forming surface during the contacting. Such different viscosities can enable forming of the shaped glass article while avoiding potentially detrimental surface interaction between the shaped glass article and the forming surface.

FIG. 1 is a cross-sectional view of one exemplary embodiment of a glass sheet 100. In some embodiments, glass sheet 100 comprises a laminated sheet comprising a plurality of glass layers. The laminated sheet can be substantially planar as shown in FIG. 1 or non-planar. Glass sheet 100 comprises a core layer 102 disposed between a first cladding layer 104 and a second cladding layer 106. In some embodiments, first cladding layer 104 and second cladding layer 106 are exterior layers as shown in FIG. 1. In other embodiments, the first cladding layer and/or the second cladding layer are intermediate layers disposed between the core layer and an exterior layer.

Core layer 102 comprises a first major surface and a second major surface opposite the first major surface. In some embodiments, first cladding layer 104 is fused to the first major surface of core layer 102. Additionally, or alternatively, second cladding layer 106 is fused to the second major surface of core layer 102. In such embodiments, the interfaces between first cladding layer 104 and core layer 102 and/or between second cladding layer 106 and core layer 102 are free of any bonding material such as, for example, an adhesive, a coating layer, or any non-glass material added or configured to adhere the respective cladding layers to the core layer. Thus, first cladding layer 104 and/or second cladding layer 106 are fused directly to core layer 102 or are directly adjacent to core layer 102. In some embodiments, the glass sheet comprises one or more intermediate layers disposed between the core layer and the first cladding layer and/or between the core layer and the second cladding layer. For example, the intermediate layers comprise intermediate glass layers and/or diffusion layers formed at the interface of the core layer and the cladding layer. The diffusion layer can comprise a blended region comprising components of each layer adjacent to the diffusion layer. In some embodiments, glass sheet 100 comprises a glass-glass laminate (e.g., an in situ fused multilayer glass-glass laminate) in which the interfaces between directly adjacent glass layers are glass-glass interfaces.

In some embodiments, the first layer (e.g., core layer 102) comprises a first glass composition, and the second layer (e.g., first and/or second cladding layers 104 and 106) comprises a second glass composition that is different than the first glass composition. For example, in the embodiment shown in FIG. 1, core layer 102 comprises the first glass composition, and each of first cladding layer 104 and second cladding layer 106 comprises the second glass composition. In other embodiments, the first cladding layer comprises the second glass composition, and the second cladding layer comprises a third glass composition that is different than the first glass composition and/or the second glass composition.

Figure 2:
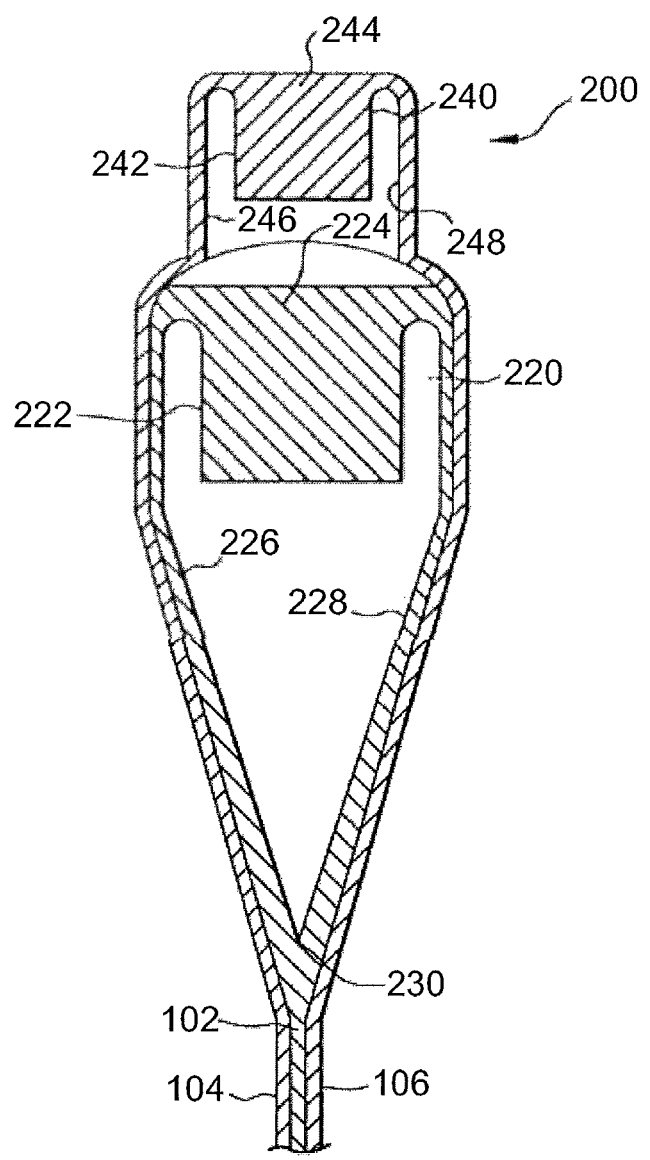
FIG. 2 is a cross-sectional view of one exemplary embodiment of an overflow distributor that can be used to form a glass article.

The glass sheet can be formed using a suitable process such as, for example, a fusion draw, down draw, slot draw, up draw, or float process. The various layers of the glass sheet can be laminated during forming of the glass sheet or formed independently and subsequently laminated to form the glass sheet. In some embodiments, the glass sheet is formed using a fusion draw process. FIG. 2 is a cross-sectional view of one exemplary embodiment of an overflow distributor 200 that can be used to form a glass sheet such as, for example, glass sheet 100. Overflow distributor 200 can be configured as described in U.S. Pat. No. 4,214,886, which is incorporated herein by reference in its entirety. For example, overflow distributor 200 comprises a lower overflow distributor 220 and an upper overflow distributor 240 positioned above the lower overflow distributor. Lower overflow distributor 220 comprises a trough 222. A first glass composition 224 is melted and fed into trough 222 in a viscous state. First glass composition 224 forms core layer 102 of glass sheet 100 as further described below. Upper overflow distributor 240 comprises a trough 242. A second glass composition 244 is melted and fed into trough 242 in a viscous state. Second glass composition 244 forms first and second cladding layers 104 and 106 of glass sheet 100 as further described below.

First glass composition 224 overflows trough 222 and flows down opposing outer forming surfaces 226 and 228 of lower overflow distributor 220. Outer forming surfaces 226 and 228 converge at a draw line 230. The separate streams of first glass composition 224 flowing down respective outer forming surfaces 226 and 228 of lower overflow distributor 220 converge at draw line 230 where they are fused together to form core layer 102 of glass sheet 100.

Second glass composition 244 overflows trough 242 and flows down opposing outer forming surfaces 246 and 248 of upper overflow distributor 240. Second glass composition 244 is deflected outward by upper overflow distributor 240 such that the second glass composition flows around lower overflow distributor 220 and contacts first glass composition 224 flowing over outer forming surfaces 226 and 228 of the lower overflow distributor. The separate streams of second glass composition 244 are fused to the respective separate streams of first glass composition 224 flowing down respective outer forming surfaces 226 and 228 of lower overflow distributor 220. Upon convergence of the streams of first glass composition 224 at draw line 230, second glass composition 244 forms first and second cladding layers 104 and 106 of glass sheet 100.

In some embodiments, first glass composition 224 of core layer 102 in the viscous state is contacted with second glass composition 244 of first and second cladding layers 104 and 106 in the viscous state to form the laminated sheet. In some of such embodiments, the laminated sheet is part of a glass ribbon traveling away from draw line 230 of lower overflow distributor 220 as shown in FIG. 2. The glass ribbon can be drawn away from lower overflow distributor 220 by a suitable means including, for example, gravity and/or pulling rollers. The glass ribbon cools as it travels away from lower overflow distributor 220. The glass ribbon is severed to separate the laminated sheet therefrom. Thus, the laminated sheet is cut from the glass ribbon. The glass ribbon can be severed using a suitable technique such as, for example, scoring, bending, thermally shocking, and/or laser cutting. In some embodiments, glass sheet 100 comprises the laminated sheet as shown in FIG. 1. In other embodiments, the laminated sheet can be processed further (e.g., by cutting or molding) to form glass sheet 100.

Although glass sheet 100 shown in FIG. 1 comprises three layers, other embodiments are included in this disclosure. In other embodiments, a glass sheet can have a determined number of layers, such as two, four, or more layers. For example, a glass sheet comprising two layers can be formed using two overflow distributors positioned so that the two layers are joined while traveling away from the respective draw lines of the overflow distributors or using a single overflow distributor with a divided trough so that two glass compositions flow over opposing outer forming surfaces of the overflow distributor and converge at the draw line of the overflow distributor. A glass sheet comprising four or more layers can be formed using additional overflow distributors and/or using overflow distributors with divided troughs. Thus, a glass sheet having a determined number of layers can be formed by modifying the overflow distributor accordingly.

In some embodiments, glass sheet 100 comprises a thickness of at least about 0.05 mm, at least about 0.1 mm, at least about 0.2 mm, or at least about 0.3 mm. Additionally, or alternatively, glass sheet 100 comprises a thickness of at most about 3 mm, at most about 2 mm, at most about 1.5 mm, at most about 1 mm, at most about 0.7 mm, or at most about 0.5 mm. In some embodiments, a ratio of a thickness of core layer 102 to a thickness of glass sheet 100 is at least about 0.6, at least about 0.7, at least about 0.8, at least about 0.85, at least about 0.9, or at least about 0.95. In some embodiments, a thickness of the second layer (e.g., each of first cladding layer 104 and second cladding layer 106) is from about 0.01 mm to about 0.3 mm.

In some embodiments, glass sheet 100 is configured as a strengthened glass sheet. Thus, the shaped glass article formed from glass sheet 100 as described herein comprises a strengthened shaped glass article. For example, in some embodiments, the second glass composition of the second layer (e.g., first and/or second cladding layers 104 and 106) comprises a different average coefficient of thermal expansion (CTE) than the first glass composition of the first layer (e.g., core layer 102). For example, first and second cladding layers 104 and 106 are formed from a glass composition having a lower average CTE than core layer 102. The CTE mismatch (i.e., the difference between the average CTE of first and second cladding layers 104 and 106 and the average CTE of core layer 102) results in formation of compressive stress in the cladding layers and tensile stress in the core layer upon cooling of glass sheet 100. In various embodiments, each of the first and second cladding layers, independently, can have a higher average CTE, a lower average CTE, or substantially the same average CTE as the core layer.

In some embodiments, the average CTE of the first layer (e.g., core layer 102) and the average CTE of the second layer (e.g., first and/or second cladding layers 104 and 106) differ by at least about $5\times10^{-7}$ °C.$^{-1}$, at least about $15\times10^{-7}$ °C.$^{-1}$, or at least about $25\times10^{-7}$ °C.$^{-1}$. Additionally, or alternatively, the average CTE of the first layer and the average CTE of the second layer differ by at most about $55\times10^{-7}$ °C.$^{-1}$, at most about $50\times10^{-7}$ °C.$^{-1}$, at most about $40\times10^{-7}$ °C.$^{-1}$, at most about $30\times10^{-7}$ °C.$^{-1}$, at most about $20\times10^{-7}$ °C.$^{-1}$, or at most about $10\times10^{-7}$ °C.$^{-1}$. For example, in some embodiments, the average CTE of the first layer and the average CTE of the second layer differ by from about $5\times10^{-7}$ °C.$^{-1}$ to about $30\times10^{-7}$ °C.$^{-1}$ or from about $5\times10^{-7}$ °C.$^{-1}$ to about $20\times10^{-7}$ °C.$^{-1}$. In some embodiments, the second glass composition of the second layer comprises an average CTE of at most about $40\times10^{-7}$ °C.$^{-1}$, or at most about $35\times10^{-7}$ °C.$^{-1}$. Additionally, or alternatively, the second glass composition of the second layer comprises an average CTE of at least about $25\times10^{-7}$ °C.$^{-1}$, or at least about $30\times10^{-7}$ °C.$^{-1}$. Additionally, or alternatively, the first glass composition of the first layer comprises an average CTE of at least about $40\times10^{-7}$ °C.$^{-1}$, at least about $50\times10^{-7}$ °C.$^{-1}$, or at least about $55\times10^{-7}$ °C.$^{-1}$. Additionally, or alternatively, the first glass composition of the first layer comprises an average CTE of at most about $90\times10^{-7}$ °C.$^{-1}$, at most about $85\times10^{-7}$ °C.$^{-1}$, at most about $80\times10^{-7}$ °C.$^{-1}$, at most about $70\times10^{-7}$ °C.$^{-1}$, or at most about $60\times10^{-7}$ °C.$^{-1}$.

In some embodiments, the compressive stress of the cladding layers is at most about 800 MPa, at most about 500 MPa, at most about 300 MPa, at most about 200 MPa, at most about 150 MPa, at most about 100 MPa, at most about 50 MPa, or at most about 40 MPa. Additionally, or alternatively, the compressive stress of the cladding layers is at least about 10 MPa, at least about 20 MPa, at least about 30 MPa, at least about 50 MPa, at least about 100 MPa, or at least about 200 MPa.

In some embodiments, the first glass composition of the first layer comprises a lower softening point than the second glass composition of the second layer. For example, in the embodiment shown in FIG. 1, the first glass composition of core layer 102 comprises a lower softening point than the second glass composition of first cladding layer 104 and/or second cladding layer 106. Such different softening points can enable forming of glass sheet 100 into a shaped glass article while avoiding potentially detrimental surface interaction between the glass sheet and the forming surface as described herein.

In some embodiments, the softening point of the first glass composition differs from the softening point of the second glass composition by at least about 5° C., at least about 15° C., at least about 50° C., or at least about 80° C. Additionally, or alternatively, the softening point of the first glass composition differs from the softening point of the second glass composition by at most about 100° C. In some embodiments the first glass composition comprises a softening point of at most about 900° C., at most about 880° C., at most about 800° C., or at most about 775° C. Additionally, or alternatively, the first glass composition comprises a softening point of at least about 600° C., at least about 700° C., or at least about 800° C. Additionally, or alternatively, the second glass composition comprises a softening point of at most about 1000° C., at most about 975° C., at most about 900° C., or at most about 800° C. Additionally, or alternatively, the second glass composition comprises a softening point of at least about 700° C., at least about 800° C., or at least about 900° C.

In some embodiments, the first glass composition of the first layer comprises a lower $10^{8.2}$ P temperature than the second glass composition of the second layer. For example, in some embodiments, the $10^{8.2}$ P temperature of the first glass composition differs from the $10^{8.2}$ P temperature of the second glass composition by at least about 5° C., at least about 15° C., at least about 50° C., or at least about 80° C. Additionally, or alternatively, the $10^{8.2}$ P temperature of the first glass composition differs from the $10^{8.2}$ P temperature of the second glass composition by at most about 125° C., at most about 110° C., or at most about 100° C.

In some embodiments, the first glass composition of the first layer comprises a lower viscosity than the second glass composition of the second layer at various temperatures. In other words, all or a portion of the viscosity curve of the first glass composition lies beneath the viscosity curve of the second glass composition. For example, the first glass composition of the first layer comprises a lower $10^{7.4}$ P temperature than the second glass composition of the second layer and/or a lower $10^{10}$ P temperature than the second glass composition of the second layer.

Figure 3:
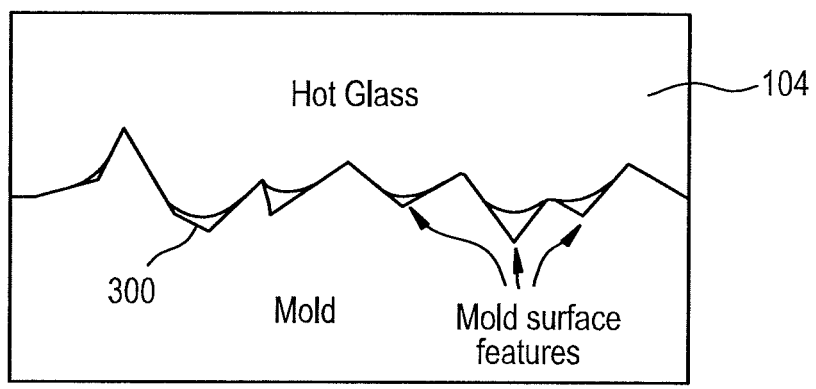
FIG. 3 is a close up view of an interface between an outer surface of a glass sheet and one exemplary embodiment of a forming surface.

In some embodiments, glass sheet 100 is contacted with a forming surface to form a shaped glass article. Such a process can be referred to as a reforming process or a molding process. FIG. 3 is a close-up view of the interface between an outer surface of a glass sheet and one exemplary embodiment of a forming surface 300. Forming surface 300 can comprise a forming surface of a suitable forming unit or mold including, for example, a vacuum mold, a pressure mold, a sagging mold, or a press mold. In some embodiments, the forming unit comprises a one-mold forming unit (e.g., a vacuum mold, a pressure mold, or a sagging mold). The one-mold forming unit comprises a single forming surface as opposed to two or more forming surfaces that are pressed together to form the shaped glass article.

Figure 4:
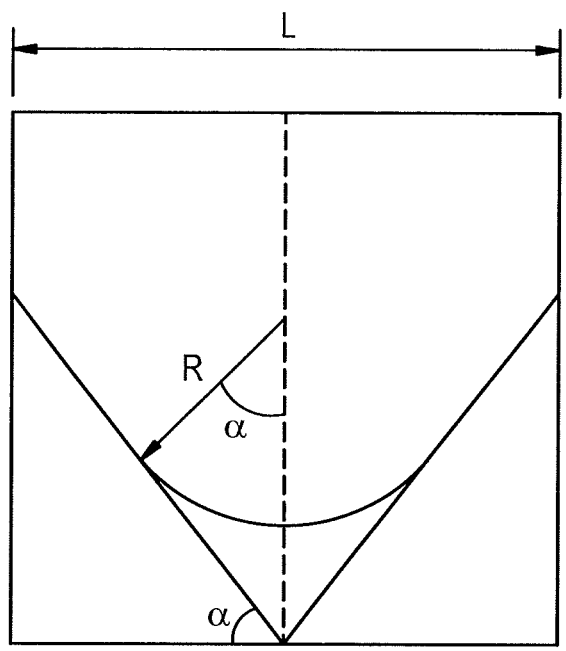
FIG. 4 is a pictorial representation of an analytical model that can be used to represent the interaction between a glass sheet and a forming surface.

FIG. 4 is a pictorial representation of an analytical model that can be used to represent the interaction between a glass sheet and a forming surface. A parameter R comprises a surface radius of a portion of the glass sheet in contact with a surface feature (e.g., a divot or imperfection) of the forming surface. As the surface of the glass sheet conforms more closely to the shape of the surface feature, parameter R becomes smaller. As parameter R becomes smaller, the contact area between the surface feature of the forming surface and the glass sheet becomes larger. Such a larger contact area can result in reduced surface quality of the resulting shaped glass article and/or increased wear on the forming surface.

Figure 5:
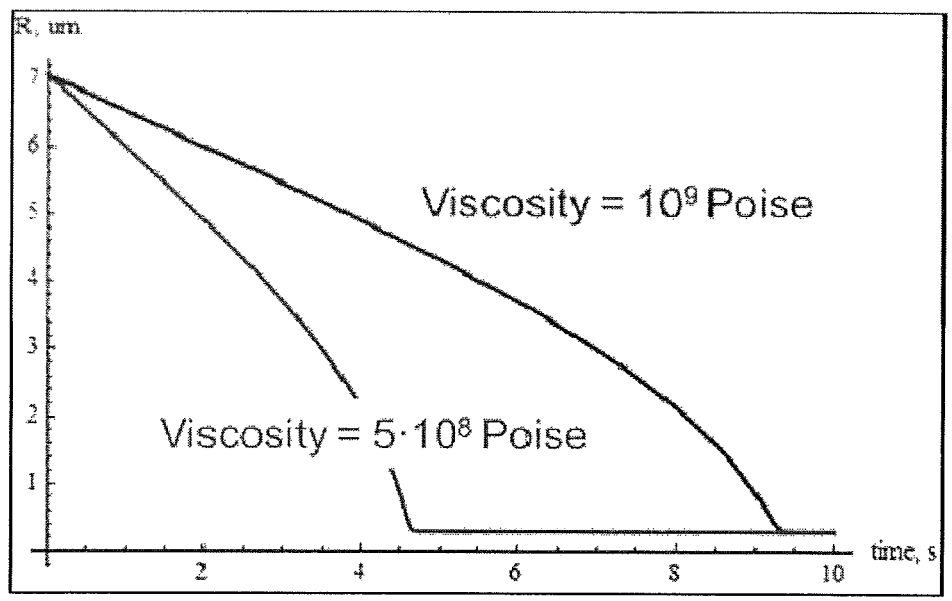
FIG. 5 is a graphical representation of the dynamics of glasses with different viscosities filling the surface feature of the forming surface as shown in FIG. 4.

FIG. 5 is a graphical representation of the dynamics of glasses with different viscosities filling the surface feature of the forming surface as shown in FIG. 4. The effective contact area between the glass sheet and the surface feature of the forming surface increases with time until reaching an equilibrium contact area. Thus, the parameter R decreases with time until reaching an equilibrium value as shown in FIG. 5. Without wishing to be bound by any theory, it is believed that the equilibrium is a result of a balance between the applied pressing force and capillary forces. For a given process duration (e.g., 5 s), the more viscous glass experiences a smaller deformation compared to the less viscous glass. The smaller deformation is evidenced by a larger parameter R for the given process duration, which represents a smaller contact area with the forming surface.

In a typical molding operation, glass is heated to its softening point and then contacted with a forming surface of a mold. The glass is deformed to conform to the contour of the forming surface. Thus, the resulting shaped glass article comprises a 3-dimensional (3D) shape that is complementary to the shape of the forming surface. The viscosity of the glass is low enough to allow viscous deformation to form the shaped glass article with the desired 3D shape (e.g., to achieve a sufficiently small bend radius). However, if the viscosity of the glass is too low, imperfections in the forming surface can be micro imprinted on the glass and/or the glass can stick to the forming surface, which can cause glass surface damage and/or mold degradation. Thus, lower glass viscosity during forming can aid in achieving a glass article with the desired 3D shape, and higher glass viscosity during forming can aid in avoiding defects on the surface of the glass article and/or mold degradation. The forming surface can be coated with a coating material to reduce glass surface damage and/or mold degradation. However, such a coating can increase the cost of the molding operation. Additionally, or alternatively, the glass article can be formed at an increased forming viscosity. However, such increased forming viscosity can increase the forming time and/or limit the bend radius that can be achieved.

In some embodiments, contacting the glass sheet with the forming surface comprises contacting the second layer of the glass sheet with the forming surface without also contacting the first layer of the glass sheet with the forming surface. For example, first cladding layer 104 of glass sheet 100 is contacted with forming surface 300. First cladding layer 104 is disposed between core layer 102 and forming surface 300 such that the core layer is uncontacted by the forming surface. Glass sheet 100, or a portion thereof, is contacted at a forming temperature that is sufficiently high that the glass sheet is deformed in response to the contacting to conform to the shape of the forming surface and form the shaped glass article. In some embodiments, a maximum temperature of glass sheet 100 during the contacting by forming surface 300 (i.e., a maximum forming temperature) is at most about 900° C. or at most about 850° C.

In some embodiments, the first glass composition of core layer 102 comprises a lower softening point than the second glass composition of first cladding layer 104 and/or second cladding layer 106 as described herein. Thus, glass sheet 100 comprises a relatively hard cladding (e.g., formed by first cladding layer 104 and/or second cladding layer 106) at least partially enveloping a relatively soft core (e.g., formed by core layer 102). Contacting glass sheet 100 with forming surface 300 comprises contacting the relatively hard cladding without also contacting the relatively soft core. The relatively soft core can enable forming of glass sheet 100 into the shaped glass article with the desired 3D shape. Additionally, or alternatively, the relatively hard cladding can aid in avoiding surface damage to the shaped glass article and/or damage to forming surface 300 (e.g., by avoiding surface interaction between the relatively hard cladding and the forming surface).

An effective viscosity $\mu_{eff}$ of glass sheet 100 at a particular temperature (e.g., the forming temperature) comprises a thickness weighted average viscosity of the glass sheet at the particular temperature. For example, in some embodiments, core layer 102 comprises a thickness $t_{core}$, and each of first cladding layer 104 and second cladding layer 106 comprises a thickness $t_{clad}$. The first glass composition comprises a viscosity $\mu_{core}$ at the particular temperature, and the second glass composition comprises a viscosity $\mu_{clad}$ at the particular temperature. Thus, the effective viscosity of glass sheet 100 at the particular temperature is represented by equation 1.

$$\mu_{eff} = \frac{T_{core}\mu_{core} + 2t_{clad}\mu_{clad}}{t_{core} + 2t_{clad}} \quad (1)$$

In some embodiments, effective viscosity $\mu_{eff}$ of glass sheet 100 during contacting by forming surface 300 is less than a contact viscosity (e.g., a surface viscosity) of the glass sheet in contact with the forming surface during the contacting. For example, effective viscosity $\mu_{eff}$ of glass sheet 100 during contacting by forming surface 300 is less than viscosity $\mu_{clad}$ of first cladding layer 104 of the glass sheet, which is in contact with the forming surface as described herein. The lower effective viscosity of glass sheet 100 at the forming temperature can enable forming of the glass sheet into a glass article having the desired 3D shape. For example, glass sheet 100 can be formed into a 3D shape comprising a small bend radius similar to that achievable with a single layer glass sheet having a low viscosity at the forming temperature (e.g., similar to effective viscosity $\mu_{eff}$ of glass sheet 100). Additionally, or alternatively, surface interaction between glass sheet 100 and forming surface 300 can be avoided in a manner similar to that achievable with a single layer glass sheet having a high viscosity at the forming temperature (e.g., similar to viscosity $\mu_{clad}$ of glass sheet 100). In other words, glass sheet 100 can comprise a relatively low effective viscosity $\mu_{eff}$ to enable effective shape replication and also a relatively high contact viscosity $\mu_{clad}$ to enable enhanced glass surface quality and/or mold lifetime.

Contacting glass sheet 100 with forming surface 300 as described herein can enable a shaped glass article with improved surface properties compared to forming a single-layer glass sheet. For example, in some embodiments, the shaped glass article comprises a surface roughness ($R_a$) of at most about 1 nm, at most about 0.9 nm, at most about 0.8 nm, or at most about 0.7 nm. The surface roughness can be measured as described in ASTM F2791. Additionally, or alternatively, the shaped glass article comprises a waviness of at most about 50 nm, at most about 50 nm, at most about 30 nm, or at most about 25 nm. The waviness can be measured as described in ASTM C1652/C1652M. In some embodiments, the shaped glass article with improved surface properties is strengthened (e.g., by CTE mismatch and/or ion-exchange) as described herein.

In some embodiments, glass sheet 100 comprises an effective temperature corresponding to a particular effective viscosity. The effective temperature comprises the temperature of glass sheet 100 at which the glass sheet comprises the particular effective viscosity $\mu_{eff}$. For example, an effective $10^{8.2}$ P temperature of glass sheet 100 comprises the temperature at which effective viscosity $\mu_{eff}$ of the glass sheet is $10^{8.2}$ P. In some embodiments, glass sheet 100 comprises an effective $10^{8.2}$ P temperature of at most about 900° C., at most about 875° C., at most about 850° C., at most about 800° C., or at most about 750° C. Additionally, or alternatively, glass sheet 100 comprises an effective $10^{8.2}$ P temperature of at least about 400° C.

The forming temperature of the glass sheet can depend on the forming technique that is used, and can be at least an effective temperature corresponding to a particular effective viscosity. For example, the forming temperature is at least the effective $10^{10}$ P temperature of the glass sheet, at least the effective $10^{8.2}$ P temperature of the glass sheet, or at least the effective $10^{7.4}$ P temperature of the glass sheet.

Figure 6:
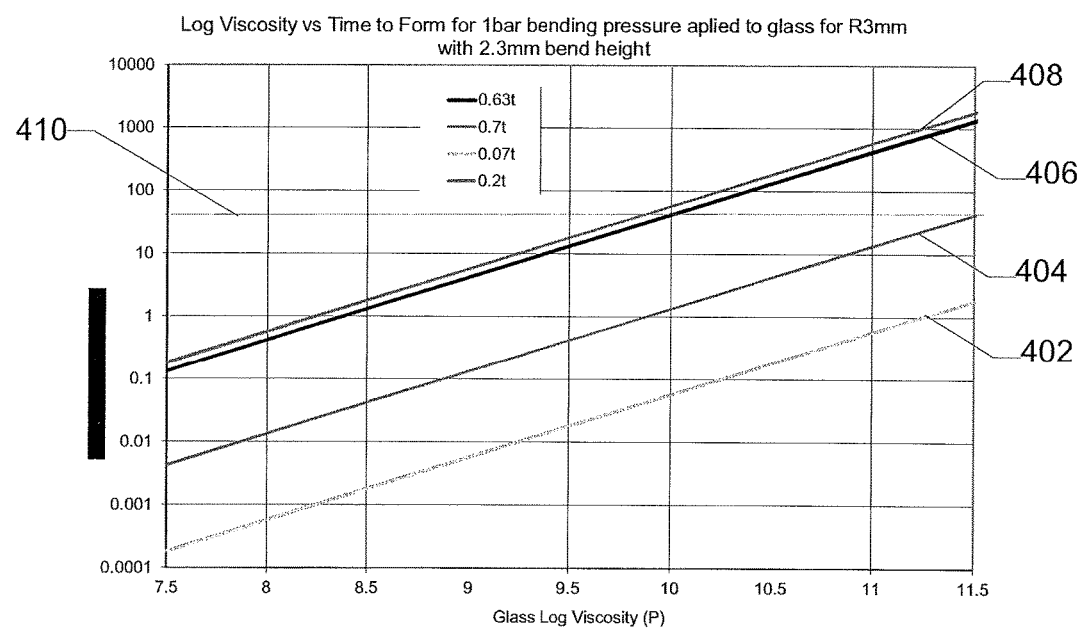
FIG. 6 is a graphical illustration of the predicted time to form a bend having a 3 mm radius and a 2.3 mm bend height by applying a 1 bar bending pressure as a function of glass viscosity for glass sheets ranging in thickness from 0.07 mm to 0.7 mm.

In some embodiments, glass sheet 100 is deformed in response to the contact with forming surface 300 to conform to the shape of the forming surface and form the shaped glass article. FIG. 6 is a graphical illustration of the predicted time to form a bend having a 3 mm radius and a 2.3 mm bend height by applying a 1 bar bending pressure as a function of glass viscosity for glass sheets ranging in thickness from 0.07 mm to 0.7 mm. Line 402 corresponds to a glass sheet having a thickness of 0.07 mm. Line 404 corresponds to a glass sheet having a thickness of 0.2 mm. Line 406 corresponds to a glass sheet having a thickness of 0.63 mm. Line 408 corresponds to a glass sheet having a thickness of 0.7 mm. A horizontal line 410 shows that the 0.7 mm thick glass sheet with a glass viscosity of $10^{9.8}$ P takes 57 seconds to bend under the simulated conditions. In contrast, the 0.2 mm thick glass sheet can have a viscosity of $10^{11.5}$ P to bend in 57 seconds, and the 0.07 mm thick glass sheet can have a significantly higher viscosity (e.g., greater than $10^{11.5}$ P, provided the glass remains viscoelastic) to bend in 57 seconds.

As illustrated by FIG. 6, the forming time of a glass sheet increases significantly with increasing viscosity and with increasing thickness. Thus, the glass viscosity has a significant impact on the forming time of the glass sheet. In some embodiments, the effective viscosity of glass sheet 100 is relatively low, while the surface viscosity is relatively high as described herein. Thus, the forming time for glass sheet 100 can be relatively low (e.g., due to the relatively low effective viscosity) while avoiding potentially detrimental surface interaction with forming surface 300 (e.g., due to the relatively high surface viscosity).

Figure 7:
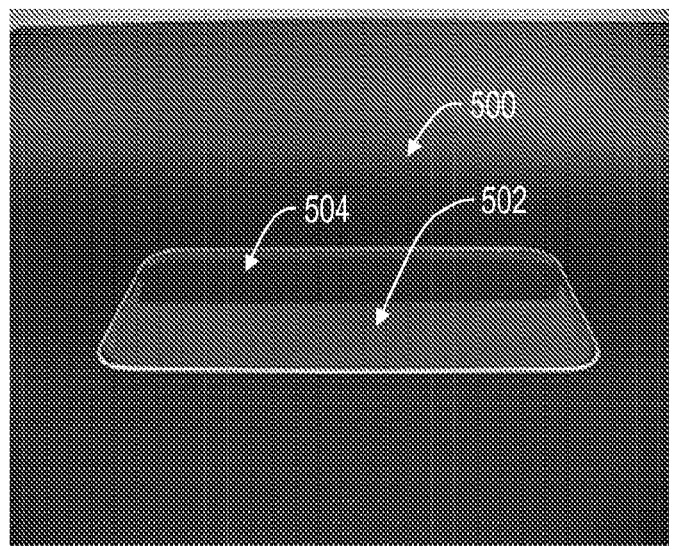
FIGS. 7-8 are photographs of one exemplary embodiment of a shaped glass article formed by contacting a glass sheet with a forming surface.
Figure 8:
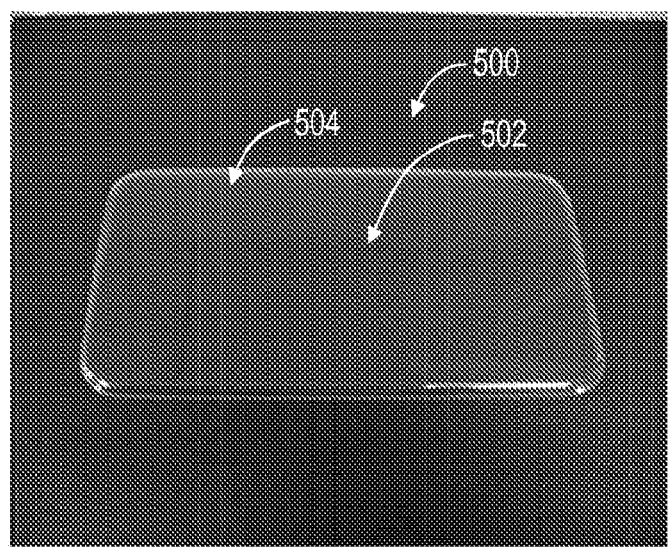

FIGS. 7-8 are photographs of one exemplary embodiment of shaped glass article 500 formed by contacting glass sheet 100 with forming surface 300. Thus, shaped glass article 500 comprises the first layer and the second layer described herein with reference to glass sheet 100. The first layer of shaped glass article 500 comprises the first glass composition, and the second layer of the shaped glass article comprises the second glass composition as described herein with reference to glass sheet 100. Thus, shaped glass article 500, or the individual layers thereof, can retain the various properties (e.g., CTE, softening point, effective viscosity, effective temperature, etc.) described herein with reference to glass sheet 100. For example, in some embodiments, shaped glass article 500 is configured as a strengthened shaped glass article (e.g., as a result of the CTE mismatch between the first layer and the second layer).

In some embodiments, shaped glass article 500 can be used, for example, as a cover glass for a portable consumer electronics device (e.g., a mobile telephone). In the embodiment shown in FIGS. 7-8, shaped glass article 500 comprises a substantially planar central region 502 encompassed by a curved lip 504. Thus, the contacting glass sheet 100 comprises forming one or more bends in the glass sheet. For example, the bends comprise curved areas of the glass sheet at the transitions between substantially planar central region 502 and curved lip 504. In some embodiments, the contacting glass sheet 100 comprises bending the glass sheet such that shaped glass article 500 comprises a bend with a radius of at most about 5 mm, at most about 4 mm, at most about 3 mm, or at most about 2 mm. Additionally, or alternatively, contacting glass sheet 100 comprises bending the glass sheet such that the shaped glass article 500 comprises a bend with a bend angle of from about 70° to about 90°, or from about 80° to about 90°. In some embodiments, the bend comprises a radiused bend. In other embodiments, the bend comprises a spline shaped bend. In some embodiments, a shape precision of the shaped glass article is +/−50 μm before or after subjecting the shaped glass article to an ion exchange process. For example, the shape of the shaped glass article is within 50 μm of the intended shape after subjecting the shaped glass article to the ion exchange process.

Although shaped glass article 500 is described as comprising a curved lip formed by four bends, one on each side of the substantially rectangular planar region, other embodiments are included in this disclosure. In other embodiments, the shaped glass article comprises a determined number of bends, such as one, two, three, or more bends. Although shaped glass article 500 is described as comprising a substantially planar central region 502 encompassed by a curved lip 504, other embodiments are included in this disclosure. In other embodiments, the shaped glass article comprises a suitable non-planar or 3D shape including, for example, dished, bent, or curved shapes.

In some embodiments, the shaped glass article is ion exchangeable. For example, the first glass composition and/or the second glass composition comprises alkali metal ions (e.g., $Li^{+1}$ or $Na^{+1}$) that can be exchanged with larger ions (e.g., $K^{+1}$ or $Ag^{+1}$) using a suitable ion exchange process to form compressive stress in the shaped glass article. In some embodiments, the ion exchange process comprises exposing the shaped glass article to a molten salt solution. Smaller cations (e.g., monovalent alkali metal cations or divalent alkaline earth metal cations) present in the shaped glass article (e.g., the first layer and/or the second layer) are replaced with larger cations (e.g., monovalent alkali metal cations, divalent alkaline earth metal cations, or $Ag^+$) present in the molten salt solution. For example, in some embodiments, $Na^+$ is replaced with $K^+$. The smaller cations and the larger cations can have the same valence or oxidation state. The replacement of smaller cations with larger cations creates a strengthened layer in the shaped glass article that is under compression or compressive stress. The strengthened layer extends into the interior or bulk of the shaped glass article to a depth of layer (DOL). In some embodiments, the strengthened shaped glass article comprises a cation concentration gradient (e.g., a $K^+$ and/or $Ag^+$ concentration gradient) in at least one of the first layer or the second layer resulting from the ion exchange process.

Generally, as the softening point and/or the strain point of a glass composition decrease, the ion exchange properties of the glass composition tend to degrade. Such degradation can be a result of stress relaxation during ion exchange (e.g., if the strain point of the glass composition is too close to the ion exchange bath temperature). Additionally, or alternatively, ion exchangeable glasses can be relatively difficult to form into shaped glass articles. For example, ion exchangeable glasses may be formed at relatively high temperatures or pressures and/or for relatively long forming times. Such difficulty can be a result of the relatively high softening point and/or strain point of ion exchangeable glasses. By incorporating the ion exchangeable glass into a laminated glass sheet (e.g., as the cladding layers) as described herein, the effective viscosity of the laminated glass sheet can be reduced to enable forming of the laminated glass sheet into a shaped glass article while retaining the ion exchange capabilities of the ion exchangeable glass.

In some embodiments, the shaped glass article comprises a CTE mismatch as described herein. In some of such embodiments, the shaped glass article is subjected to an ion exchange process to further increase the compressive stress formed in the second layer. For example, the compressive stress resulting from the CTE mismatch is between about 25 MPa and about 300 MPa or between about 100 MPa and about 200 MPa, and the compressive stress resulting from ion exchange is between about 400 MPa and about 700 MPa or between about 500 MPa and about 600 MPa. Thus, the shaped glass article comprises a total compressive stress of between about 425 MPa and about 1000 MPa or between about 600 MPa and about 800 MPa. Because the strengthening effects of the CTE mismatch and the ion exchange can be combined to achieve a shaped glass article with a desired compressive stress, the ion exchangeable glass can comprise less than optimal ion exchange capabilities. For example, relatively soft ion exchangeable glasses with somewhat degraded ion exchange capabilities can be incorporated into a laminated glass sheet comprising a CTE mismatch to be formed into a shaped glass article with the desired total strength.

Figure 9:
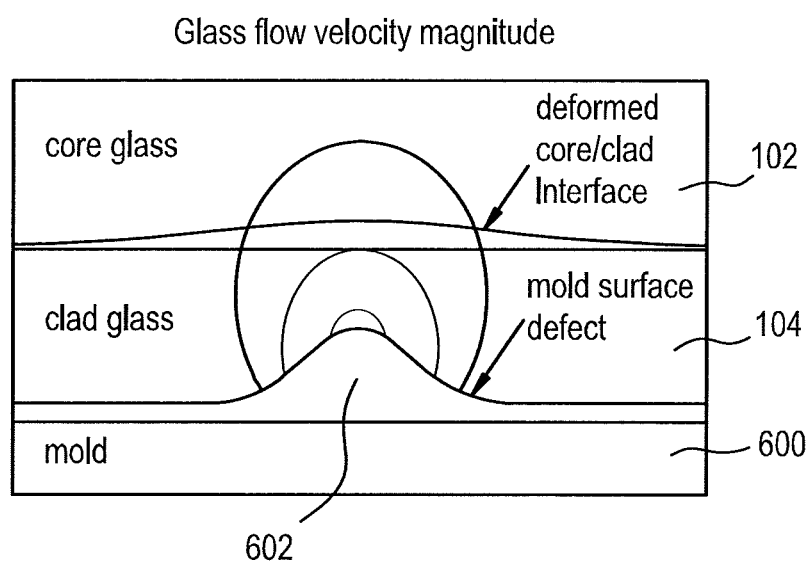
FIG. 9 illustrates a simulated response of a glass sheet to being contacted with another exemplary embodiment of a forming surface comprising a protrusion.

In some embodiments, the forming surface comprises imperfections (e.g., indentations or protrusions) that impart defects to the outer surface of glass sheet 100 during forming of the shaped glass article. The imperfections on the forming surface can be the result of manufacturing defects or of wear on the forming surface caused by repeated use. For example, FIG. 9 illustrates a simulated response of glass sheet 100 to being contacted with another exemplary embodiment of forming surface 600 comprising a protrusion 602. In some embodiments, the outer surface of glass sheet 100 is no longer pristine following contact by forming surface 600. For example, the shaped glass article formed by contacting glass sheet 100 with forming surface 600 comprises a non-smooth and/or non-uniform outer surface as shown in FIG. 9.

Figure 10:
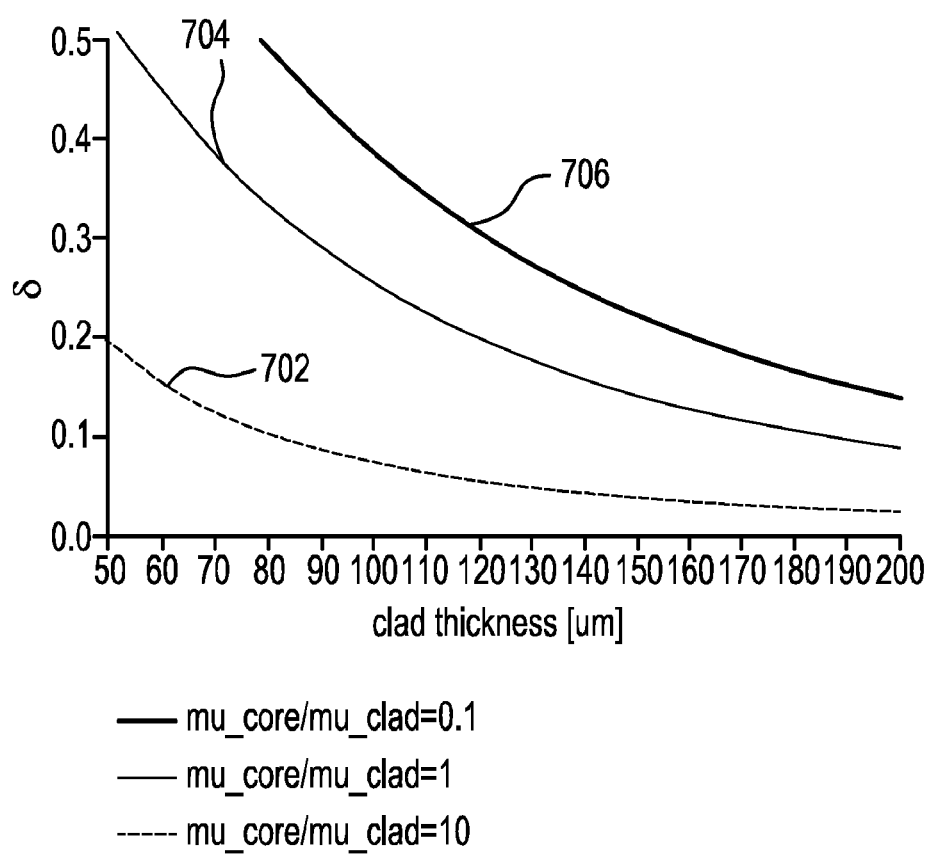
FIG. 10 is a graphical illustration of predicted attenuation of the deformation of the interface between the core layer and the first cladding layer as shown in FIG. 9 as a function of the thickness of the first cladding layer for different first glass composition to second glass composition viscosity ratios (e.g., core/clad viscosity ratios).

In some embodiments, first cladding layer 104 at least partially absorbs the effect of protrusion 602, thereby minimizing the deformation of the interface between core layer 102 and the first cladding layer. In other words, the deformation of core layer 102 at the interface is wider and smaller in amplitude compared to the deformation of first cladding layer 104 at the surface of glass sheet 100. FIG. 10 is a graphical illustration of predicted attenuation of the deformation of the interface between core layer 102 and first cladding layer 104 as a function of the thickness of the first cladding layer for different first glass composition to second glass composition viscosity ratios (e.g., ratios of core viscosity to clad viscosity). The thickness of the first cladding layer is plotted on the x-axis. A ratio, $\delta$, of the amplitude of the deformation or perturbation of the core to the amplitude of the deformation or perturbation of the clad resulting from contacting the glass article with a protrusion in a forming surface is plotted on the y-axis. Curve 702 represents a viscosity ratio of 10. Curve 704 represents a viscosity ratio of 1. Curve 706 represents a viscosity ratio of 0.1. FIG. 10 illustrates that the deformation of the interface (represented by the amplitude of the deformation of the core) is less than the deformation of first cladding layer 104 at the surface of glass sheet 100 (represented by the amplitude of the deformation of the clad). The reduced deformation of the interface compared to the deformation of the surface is represented by $\delta$ being less than 1. Thus, even a relatively thin and/or relatively viscous cladding layer can aid in maintaining the surface quality of the shaped glass article (e.g., by reducing the amplitude of the deformation of core layer 102 in response to contacting the surface of the glass sheet with protrusion 602). In other words, first cladding layer 104 protects core layer 102 from damage in response to contacting glass sheet 100 with forming surface 600.

In some embodiments, glass sheet 100 comprises a core to clad viscosity ratio of at most about 1, at most about 0.9, at most about 0.8, at most about 0.7, at most about 0.6, at most about 0.5, at most about 0.4, at most about 0.3, at most about 0.2, at most about 0.1, or at most about 0.05 at a forming temperature (e.g., a suitable forming temperature based on a particular forming technique). For example, the core to clad viscosity ratio of glass sheet 100 comprises the core to clad viscosity ratio at a an effective $10^{8.2}$ P temperature of the glass sheet. Additionally, or alternatively, the second layer of glass sheet 100 (e.g., first cladding layer 104 and/or second cladding layer 106) comprises a viscosity of at least about $10^{7.6}$ P at the forming temperature. For example, the second layer of glass sheet 100 comprises a viscosity of at least about $10^{8.3}$ P, at least about $10^{8.4}$ P, at least about $10^{8.5}$ P, at least about $10^{8.6}$ P, at least about $10^{8.7}$ P, at least about $10^{8.8}$ P, at least about $10^{8.9}$ P, or at least about $10^9$ P at the effective $10^{8.2}$ P temperature of the glass sheet.

In some embodiments, the second layer is partially or substantially entirely removed from the first layer to expose or uncover the outer surface of the first layer. For example, the damaged first cladding layer 104 is removed from core layer 102 to expose the relatively pristine outer surface of the core layer. In some embodiments, first cladding layer 104 and second cladding layer 106 are removed from core layer 102 to expose the outer surface of the core layer. The exposed outer surface of core layer 102 comprises a relatively pristine surface (e.g., having an attenuated deformation compared to that of first cladding layer 104). Removing first and/or second cladding layers 104 and 106 removes the defects in the first and second cladding layers from the shaped glass article, leaving the glass article with a relatively pristine surface substantially free of the defects imparted to the glass article by forming surface 602.

Protection of the first layer by the second layer (e.g., by at least partially enveloping the core within the clad) can prevent damage from being caused to the first layer of the glass article during forming of the shaped glass article. Protection of the first layer can enable use of a forming surface with imperfections, which can lengthen the amount of time that the forming surface can be used before replacement or repair or reconditioning of the forming surface. Protection of the first layer can enable production of the shaped glass article with a relatively pristine outer surface without grinding or polishing the shaped glass article.

In some embodiments, a portion of the second layer is selectively removed from the shaped glass article to expose or uncover a corresponding portion of the first layer. Thus, a pattern is formed on the surface of the shaped glass article by selective removal of a portion of the second layer. In some embodiments, the first glass composition of the first layer comprises a different color than the second glass composition of the second layer. Selective removal of a portion of the second layer exposes the corresponding portion of the first layer, thereby forming a multicolored pattern on the surface of the shaped glass article. Additionally, or alternatively, the first glass composition comprises a different surface attribute than the second glass composition. The surface attribute can comprise, for example, wettability, microbial affinity, optical aspect in transmission or reflection, electrical conductivity, or combinations thereof. Selective removal of a portion of the second layer exposes the corresponding portion of the first layer, thereby forming a pattern of differing surface attributes on the surface of the shaped glass article.

In some embodiments, the second layer is less durable than the first layer. For example, in the embodiment shown in FIG. 1, first cladding layer 104 and second cladding layer 106 are less durable than core layer 102. The second glass composition of first and second cladding layers 104 and 106 comprises a greater degradation rate in a reagent than the first glass composition of core layer 102. In some embodiments, the degradation rate of the second glass composition in the reagent is at least 10 times or at least 100 times greater than the degradation rate of the first glass composition in the reagent. In some embodiments, the shaped glass article is contacted with the reagent to remove the second layer from the first layer and expose the outer surface of the first layer. The difference in durability between the second layer and the first layer can enable the second layer to be removed from the first layer by contacting the shaped glass article with the reagent to degrade or dissolve the second layer without substantially degrading or dissolving the first layer.

The reagent comprises a suitable component capable of degrading or dissolving the shaped glass article (e.g., the first layer and/or the second layer). For example, the reagent comprises an acid, a base, another suitable component, or a combination thereof. In some embodiments, the reagent comprises an acid such as, for example, a mineral acid (e.g., HCl, $HNO_3$, $H_2SO_4$, $H_3PO_4$, $H_3BO_3$, HBr, $HClO_4$, or HF), a carboxylic acid (e.g., $CH_3COOH$), or a combination thereof. For example, in some embodiments, the reagent comprises HCl (e.g., 50 vol % HCl in water). Additionally, or alternatively, the reagent comprises $HNO_3$. In some embodiments, the reagent comprises a base such as, for example, LiOH, NaOH, KOH, RbOH, CsOH, $Ca(OH)_2$, $Sr(OH)_2$, $Ba(OH)_2$, or a combination thereof.

The first glass composition of the first layer (e.g., core layer 102) and the second glass composition of the second layer (e.g., first cladding layer 104 and/or second cladding layer 106) can comprise suitable glass compositions capable of forming a glass sheet with desired properties as described herein. Exemplary glass compositions are shown in Table 1. The amounts of the various components are given in Table 1 as mol % on an oxide basis. Selected properties of the glass compositions also are shown in Table 1.

In some embodiments, the first glass composition comprises a glass network former selected from the group consisting of $SiO_2$, $Al_2O_3$, $B_2O_3$, and combinations thereof. Additionally, or alternatively, the first glass composition comprises an alkali metal oxide selected from the group consisting of $Li_2O$, $Na_2O$, $K_2O$, and combinations thereof. Additionally, or alternatively, the first glass composition comprises an alkaline earth oxide selected from the group consisting of MgO, CaO, SrO, BaO, and combinations thereof. Additionally, or alternatively, the first glass composition comprises one or more additional components including, for example $SnO_2$, $Sb_2O_3$, $As_2O_3$, $Ce_2O_3$, Cl (e.g., derived from KCl or NaCl), $ZrO_2$, or $Fe_2O_3$.

In some embodiments, the second glass composition comprises a glass network former selected from the group consisting of $SiO_2$, $Al_2O_3$, $B_2O_3$, and combinations thereof. Additionally, or alternatively, the second glass composition comprises an alkali metal oxide selected from the group consisting of $Li_2O$, $Na_2O$, $K_2O$, and combinations thereof. Additionally, or alternatively, the second glass composition comprises an alkaline earth oxide selected from the group consisting of MgO, CaO, SrO, BaO, and combinations thereof. Additionally, or alternatively, the second glass composition comprises one or more additional components including, for example $SnO_2$, $Sb_2O_3$, $As_2O_3$, $Ce_2O_3$, Cl (e.g., derived from KCl or NaCl), $ZrO_2$, or $Fe_2O_3$.

In some embodiments, the first glass composition and/or the second glass composition comprise an alkali metal oxide. For example, the second glass composition comprises an ion exchangeable glass composition comprising an alkali metal oxide. Thus, the second layer of the glass article can be strengthened by subjecting the second glass composition to an ion exchange process to form an ion exchanged glass article comprising a cladding layer with a strengthened layer formed therein. In other embodiments, the first glass composition and/or the second glass composition are substantially free of alkali metal oxide. For example, the second glass composition comprises at most about 0.01 mol % alkali metal oxide. The absence of alkali metal oxide in the cladding layer can aid in reducing the surface interaction between the glass article and the forming surface, thereby enhancing the surface quality of the shaped glass article.

TABLE 1

Exemplary Glass Compositions

|  | 1 | 2 | 3 | 4 | 5 |
|---|---|---|---|---|---|
| $SiO_2$ | 63.76 | 54.02 | 66.42 | 69.19 | 66.37 |
| $Al_2O_3$ | 9.55 | 14.71 | 8.36 | 8.52 | 10.29 |
| $B_2O_3$ | 7 | 6.67 | 1.4 |  | 0.6 |
| $P_2O_5$ |  | 2.96 |  |  |  |
| $Na_2O$ |  | 17.64 | 14.5 | 13.94 | 13.8 |
| $K_2O$ | 5.78 |  | 2.71 | 1.17 | 2.4 |
| MgO | 2.49 |  | 1.02 | 6.44 | 5.74 |
| CaO | 7.4 |  |  | 0.54 | 0.59 |
| SrO | 3.95 |  |  |  |  |
| ZnO |  | 4 | 5.39 |  |  |
| BaO |  |  |  |  |  |
| $Fe_2O_3$ |  |  |  |  |  |
| $SnO_2 + Sb_2O_3$ | 0.07 | 0.2 | 0.2 | 0.19 | 0.21 |
| $ZrO_2$ |  |  |  |  |  |
| $As_2O_3$ |  |  |  |  |  |
| Density (g/cm³) | 2.507 | 2.479 | 2.538 |  | 2.453 |
| RTCTE (×10⁻⁷° C.⁻¹) |  | 87.7 | 93.3 |  |  |
| Average CTE (×10⁻⁷° C.⁻¹) | 62.4 |  |  |  | 91.1 |
| HTCTE (×10⁻⁷° C.⁻¹) | 260 | 286 | 290 |  |  |
| Softening Point (° C.) | 878 | 770 | 771 |  | 842 |
| Anneal Point (° C.) | 655 | 559 | 569 |  | 602 |
| Strain Point (° C.) | 612 | 516 | 528 |  | 553 |
| SOC |  | 33.69 |  |  |  |
| IX T-t fictivated |  |  | 410° C.-10 hr |  |  |
| DOL (µm) |  | 44 | 44 |  |  |
| CS (MPa) |  | 707 | 736 |  |  |

|  | 6 | 7 | 8 | 9 |
|---|---|---|---|---|
| $SiO_2$ | 64.64 | 61.12 | 62.39 | 59.05 |
| $Al_2O_3$ | 7.38 | 10.56 | 17.21 | 15.1 |
| $B_2O_3$ | 16.45 | 7.8 | 10.5 | 6.26 |
| $P_2O_5$ |  | 1.48 |  |  |
| $Na_2O$ |  | 16.15 |  | 0.084 |
| $K_2O$ |  | 2.67 |  | 8.059 |
| MgO | 2.21 |  | 1.41 | 1.13 |
| CaO | 8.14 |  | 7.51 | 5.16 |
| SrO | 1.11 |  | 0.83 | 5.02 |
| BaO |  |  |  | 0.08 |
| $Fe_2O_3$ |  |  |  | 0.031 |
| $SnO_2 + Sb_2O_3$ | 0.07 | 0.2 | 0.16 | 0.151 |
| $ZrO_2$ |  |  |  | 0.032 |
| $As_2O_3$ |  |  |  | 0.0002 |
| Density (g/cm³) | 2.34 | 2.448 | 2.383 | 2.468 |
| RTCTE (×10⁻⁷° C.⁻¹) |  | 93.1 |  |  |
| Average CTE (×10⁻⁷° C.⁻¹) | 35 |  | 31.7 | 59.8 |
| HTCTE (×10⁻⁷° C.⁻¹) | 207 | 390 |  |  |
| Softening Point (° C.) | 960 | 717 | 971 | 907 |
| Anneal Point (° C.) | 660 | 554 | 722 | 664 |
| Strain Point (° C.) | 615 | 518 | 669 | 615 |
| SOC |  | 31.01 |  |  |
| IX T-t fictivated |  | 410° C.-10 hr |  |  |
| DOL (µm) |  | 56 |  |  |
| CS (MPa) |  | 540 |  |  |

In some embodiments, a display (e.g., an LED or LCD display) comprises a glass article (e.g., a glass sheet and/or a shaped glass article) as described herein. For example, the display comprises a cover glass comprising the glass article. In some embodiments, the cover glass comprises an integrated cover glass and color filter. In some embodiments, the cover glass comprises an integrated touch cover glass. In some embodiments, an automotive glazing comprises a glass article as described herein. The automotive glazing comprises, for example, a windshield, a sidelite (e.g., a door glass or a quarter window), a sun roof, a moon roof, a rear backlite, a lighting cover (e.g., a headlamp or taillamp cover), a mirror (e.g., a side mirror or a rearview mirror), an instrument panel or gauge cover, an interior panel or exterior panel (e.g., for a pillar or other applique), or another suitable glass or window. In some embodiments, an architectural panel comprises a glass article as described herein.

The glass articles described herein can be used for a variety of applications including, for example, for cover glass or glass backplane applications in consumer or commercial electronic devices including, for example, LCD and LED displays, computer monitors, and automated teller machines (ATMs); for touch screen or touch sensor applications, for portable electronic devices including, for example, mobile telephones, personal media players, and tablet computers; for integrated circuit applications including, for example, semiconductor wafers; for photovoltaic applications; for architectural glass applications; for automotive or vehicular glass applications; or for commercial or household appliance applications.

EXAMPLES

Various embodiments will be further clarified by the following examples.

Example 1

A shaped glass article having the 3D shape shown in FIGS. 7-8 was formed by contacting a laminated glass sheet having the general structure shown in FIG. 1 with a forming surface of a mold. Each of the first cladding layer and the second cladding layer had a thickness of about 35 µm, and the glass sheet had a total thickness of 0.7 mm. The core layer was formed from exemplary glass composition 1. Each of the first cladding layer and the second cladding layer was formed from exemplary glass composition 6.

The shaped glass article was formed using a one-mold non-isothermal pressure forming process as described in International Patent Application Pub. No. 2012/118612, which is incorporated by reference herein in its entirety. The bends of the forming surface were hotter than the flat portion of the forming surface. The forming surface was made from Inconel 600 coated with a TiAlN/TiAl hybrid coating. The shaped glass article had a dish shape with 4 sides bent. The forming glass viscosity and mold temperature were determined by the core temperature (rather than the cladding temperature). The shaped glass article had a compressive stress of 150 MPa and a DOL of 35 µm.

Comparative Example 1

A shaped glass article was formed using the process described in Example 1, except that a single layer glass sheet was used as opposed to the laminated glass sheet. The single layer glass sheet was formed from exemplary glass composition 4.

Table 2 shows the temperatures of the glass sheet at various points during forming (identified by the mold temperatures at the various points) of the shaped glass articles according to Example 1 and Comparative Example 1. Table 2 also shows the viscosities of the core layer and the cladding layers of Example 1 and the single layer of Comparative Example 1 corresponding to the different temperatures experienced during forming of the shaped glass article.

TABLE 2

Glass Temperature and Viscosity During Forming

|  | Example 1 | | | Comparative Example 1 | |
| --- | --- | --- | --- | --- | --- |
|  | Glass Temp (° C.) | Core Viscosity (log η, Poise) | Cladding Viscosity (log η, Poise) | Glass Temp (° C.) | Glass Viscosity (log η, Poise) |
| Max forming mold Temp flat | 728 | 10.9 | 11 | 680 | 10.9 |
| Max forming mold Temp edge | 757 | 10.2 | 10.3 | 710 | 10.1 |
| Max glass forming Temp | 842 | 8.3 | 8.4 | 800 | 8.2 |
| Start mold Temp | 638 | 14 | 14 | 590 | 13.9 |
| Glass Temp at unload | 633 | 14.2 | 14.2 | 585 | 14.0 |

Figure 11:
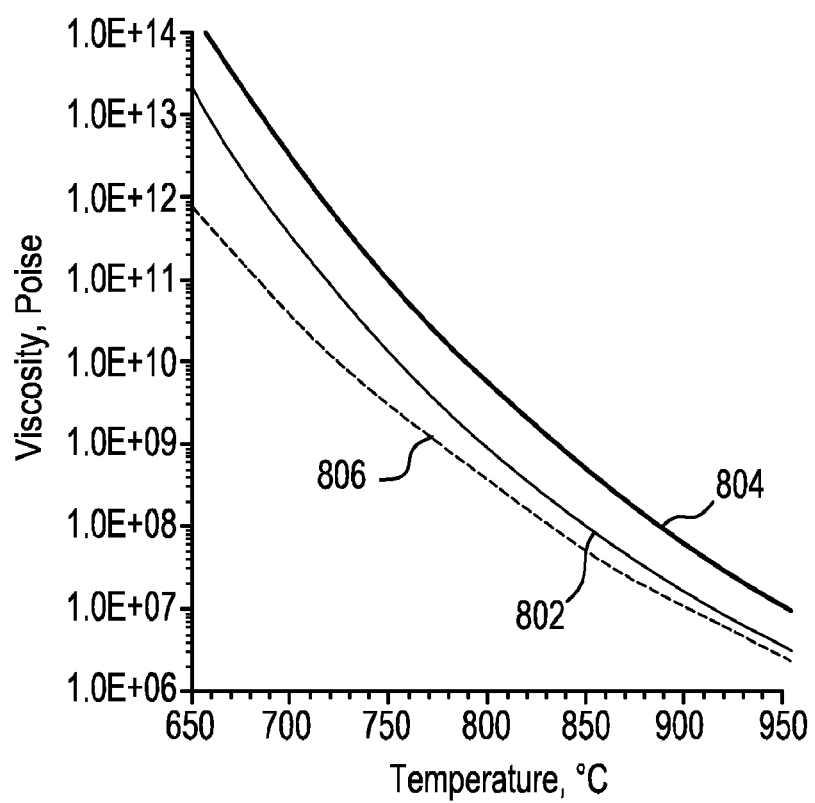
FIG. 11 is a graphical illustration of viscosity curves for exemplary glass compositions used to form shaped glass articles.

FIG. 11 is a graphical illustration of viscosity curves for the glass compositions used in Example 1 and Comparative Example 1. Curve 802 represents the viscosity curve of exemplary glass composition 1 used in Example 1. Curve 804 represents the viscosity curve of exemplary glass composition 6 used in Example 1. Curve 806 represents the viscosity curve of exemplary glass composition 4 used in Comparative Example 1.

The data shown in Table 2 and FIG. 11 illustrate that the cladding layers were at a higher viscosity than the core layer during forming of the shaped glass article according to Example 1. The core layer of the laminated glass sheet used in Example 1 had a similar viscosity to the single layer glass sheet used in Comparative Example 1. Thus, the laminated glass sheet and the single layer glass sheet can be formed at similar temperatures. It was observed that the shaped glass article formed according to Example 1 did not stick to the mold. Without wishing to be bound by any theory, it is believed that the lack of sticking is a result of the relatively high viscosity of the cladding layers during forming. Thus, forming a shaped glass article using a laminated sheet with a relatively soft core layer (e.g., with a viscosity similar to soda lime glass) and relatively hard cladding layers can enable a fast 3D shaping process (e.g., as a result of the soft core layer) with less mold deterioration (e.g., as a result of less sticking of the hard cladding layers to the mold). In other words, the hard cladding layers can be considered as an integral release layer that is incorporated into the laminated glass sheet.

Figure 12:
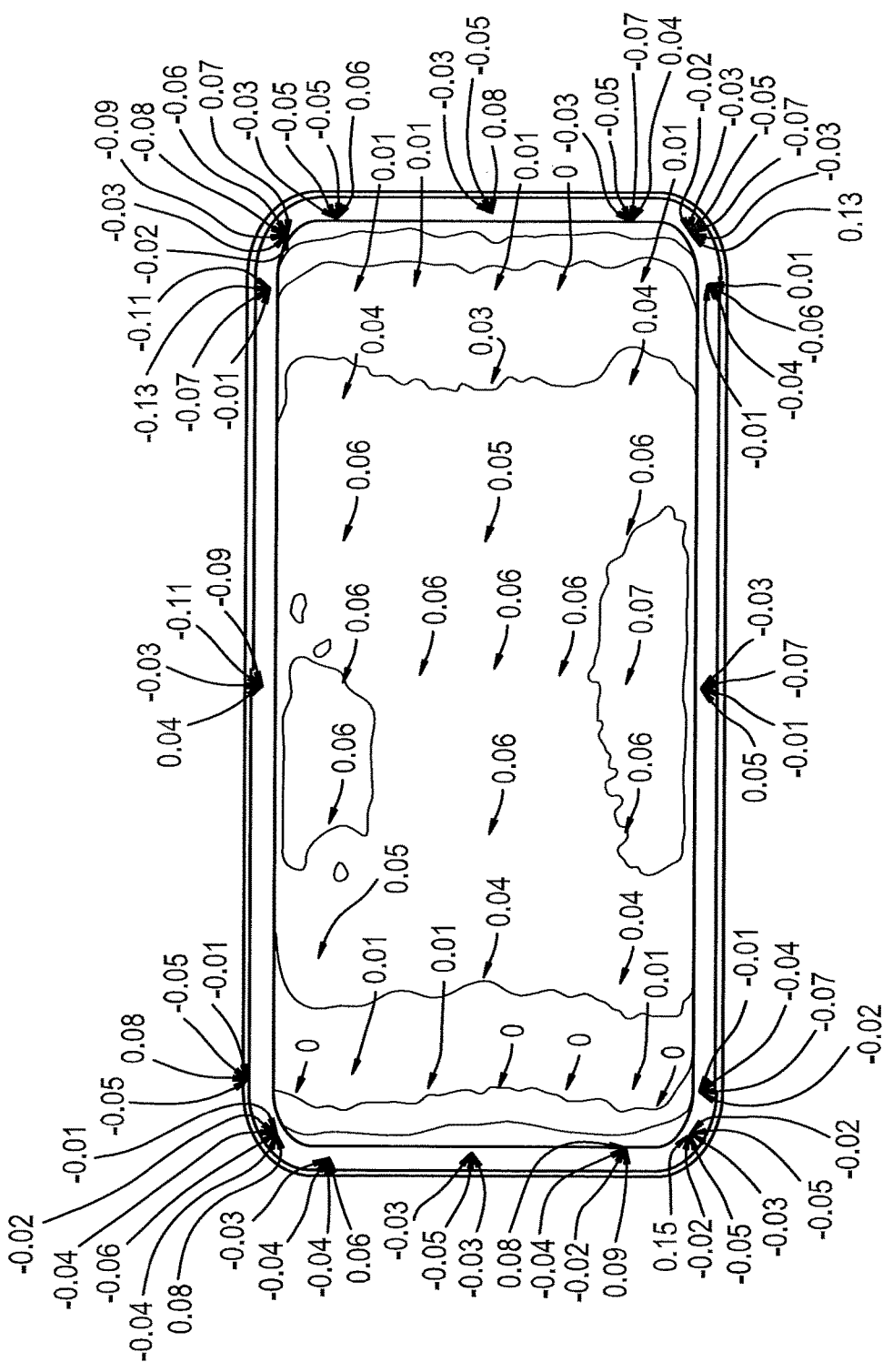
FIG. 12 illustrates the deviation of one exemplary embodiment of a shaped glass article from nominal CAD.
Figure 13:
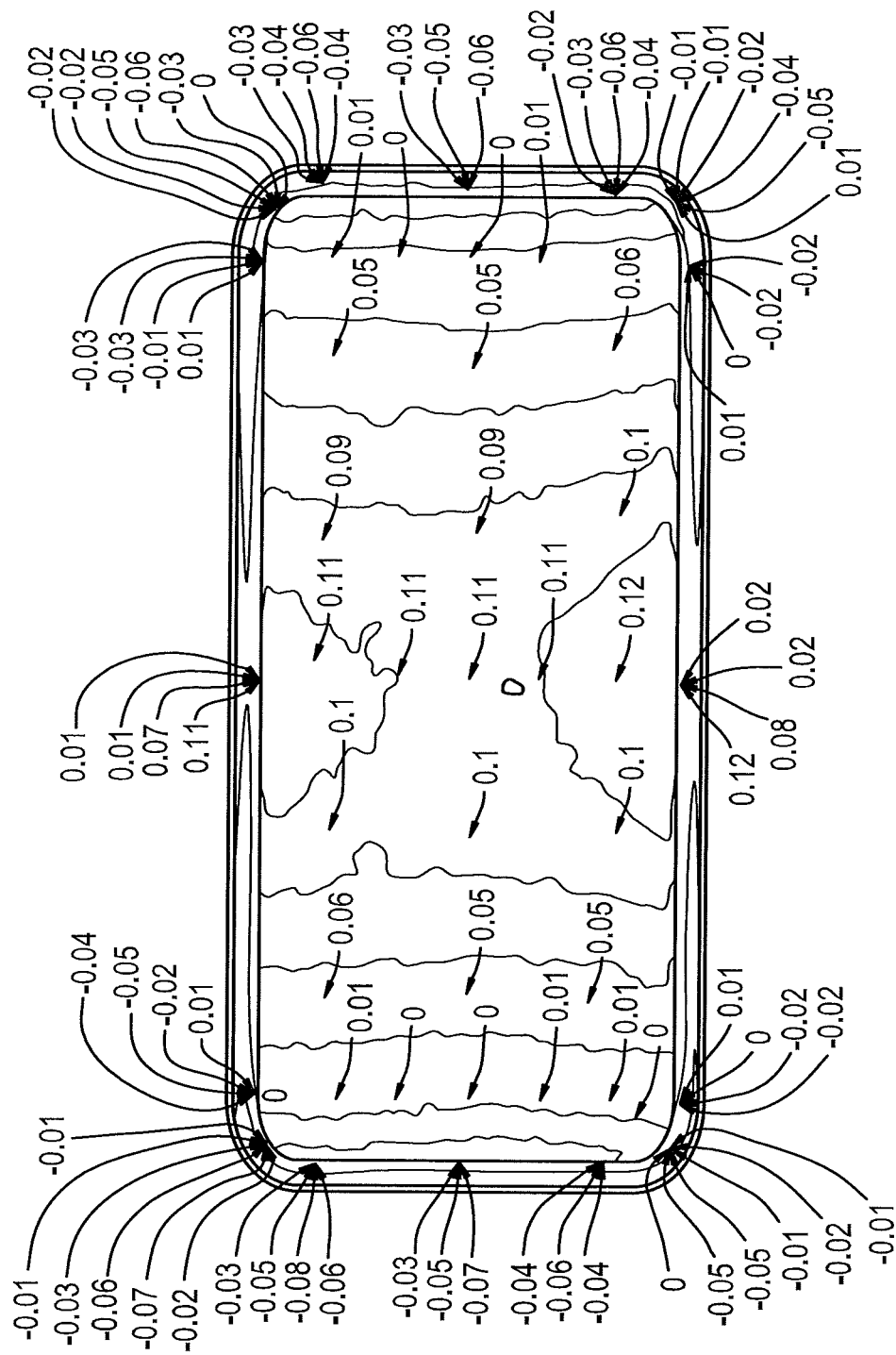
FIGS. 13-14 illustrate the deviation of another exemplary embodiment of a shaped glass article from nominal CAD before and after ion exchange.
Figure 14:
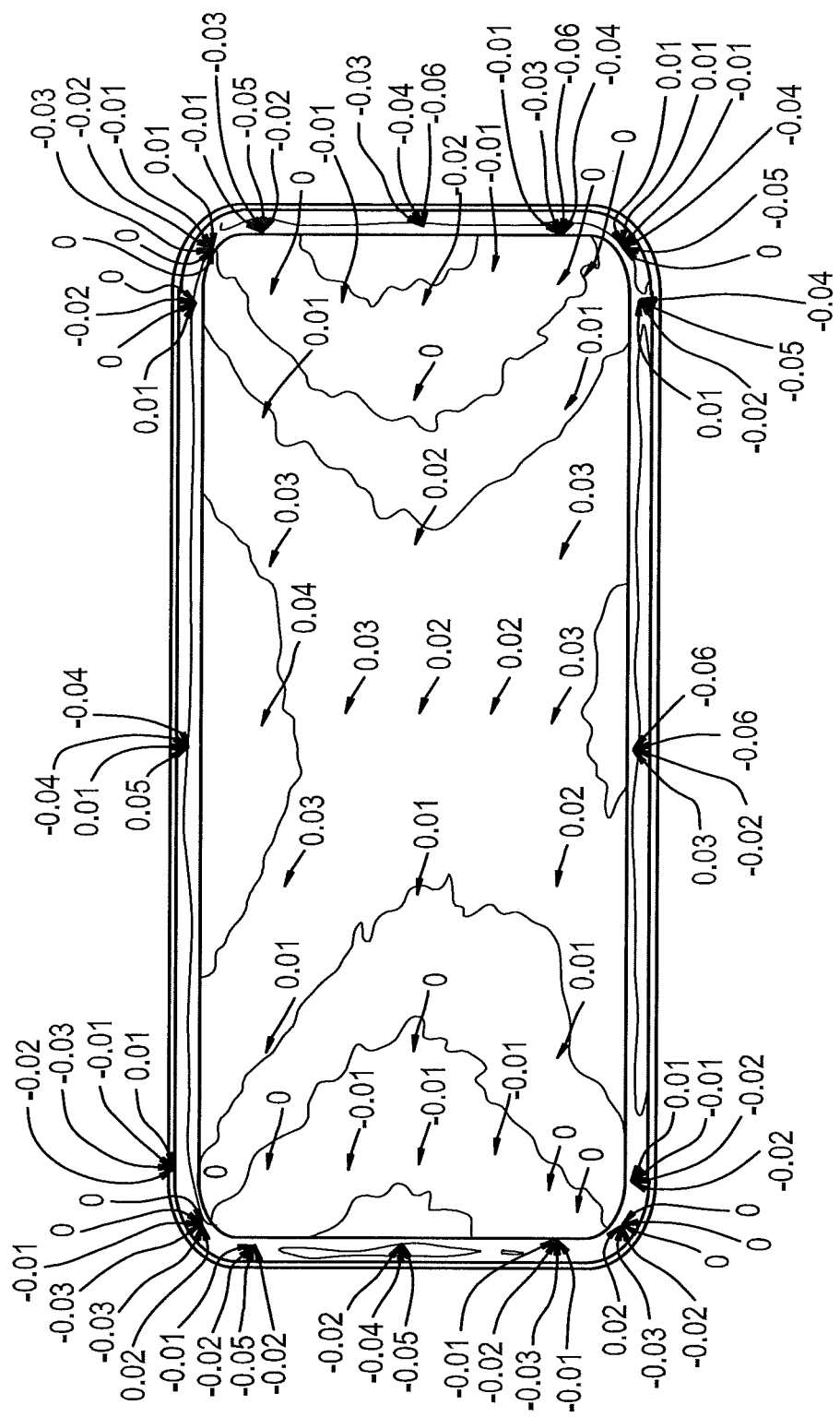

FIG. 12 illustrates the deviation of the shaped glass article formed according to Example 1 from nominal CAD, and FIGS. 13-14 illustrate the deviation of the shaped glass article formed according to Comparative Example 1 from nominal CAD before and after ion exchange, respectively. The mold was designed for the single layer glass sheet and corrected for 3D warp in ion exchange. Thus, the higher positive deviations of the shaped glass article shown in FIG. 12 are a result of higher thermal expansion of the mold at the higher forming temperature of Example 1, as well as lower thermal expansion of the laminated glass sheet compared to the single layer glass sheet. Despite the non-optimized mold design for the low expansion laminated glass sheet, the shape deviation of the shaped glass article was within +/−0.1 mm, except for the part periphery.

Figure 15:
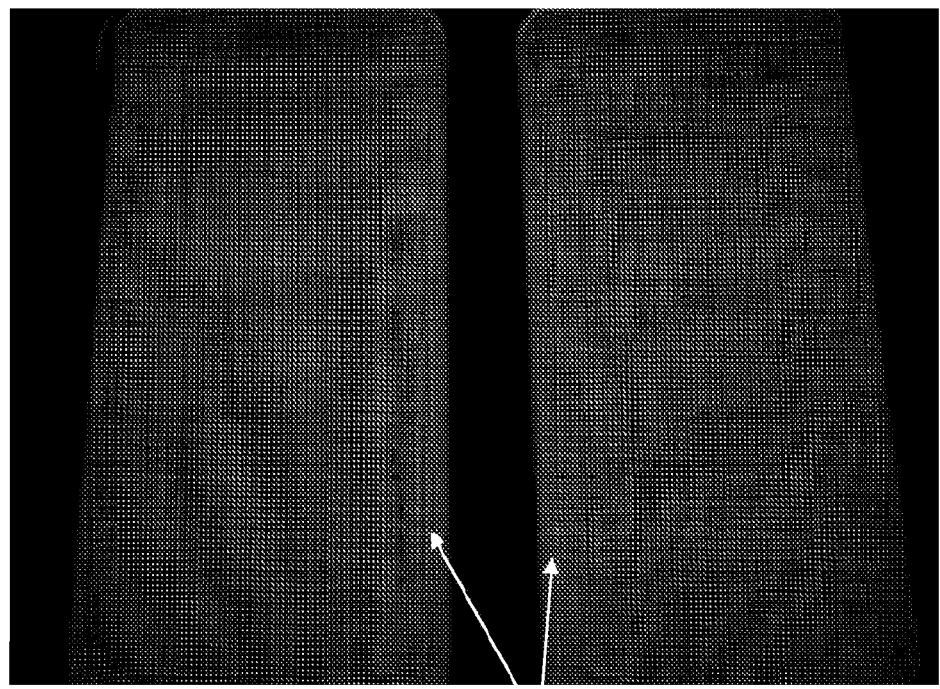
FIG. 15 is a photograph showing a grid image projected onto the surface of one exemplary embodiment of a shaped glass article formed from a laminated glass sheet (on the right) and another exemplary embodiment of a shaped glass article formed from a single layer glass sheet (on the left).

FIG. 15 is a photograph showing a grid image projected onto the surface of the shaped glass articles formed according to Example 1 (on the right) and Comparative Example 1 (on the left). The shaped glass article formed using the laminated glass sheet (Example 1) shows less optical distortion than the shaped glass article formed using the single layer glass sheet (Comparative Example 1) at the flat to bend transition. Such reduced optical distortion may be the result of the limited surface interaction between the laminated glass sheet and the forming surface (e.g., as a result of the higher viscosity of the cladding layers).

Example 2

A shaped glass article was formed using the process described in Example 1, except that the core layer was formed from exemplary glass composition 9, and each of the first cladding layer and the second cladding layer was formed from exemplary glass composition 8.

Table 3 shows the temperatures of the glass sheet at various points during forming (identified by the mold temperatures at the various points) of the shaped glass article according to Example 2. Table 3 also shows the viscosities of the core layer and the cladding layers of Example 2 corresponding to the different temperatures experienced during forming of the shaped glass article.

TABLE 3

Glass Temperature and Viscosity During Forming

|  | Example 2 | | |
| --- | --- | --- | --- |
|  | Glass Temp (° C.) | Core Viscosity (log η, Poise) | Cladding Viscosity (log η, Poise) |
| Max forming mold Temp flat | 769 | 8.9 | 11.9 |
| Max forming mold Temp edge | 800 | 8.2 | 11.2 |
| Start mold Temp | 620 | 12.8 | 16.7 |
| Glass Temp at unload | 633 | 12.4 | 16.2 |

Figure 16:
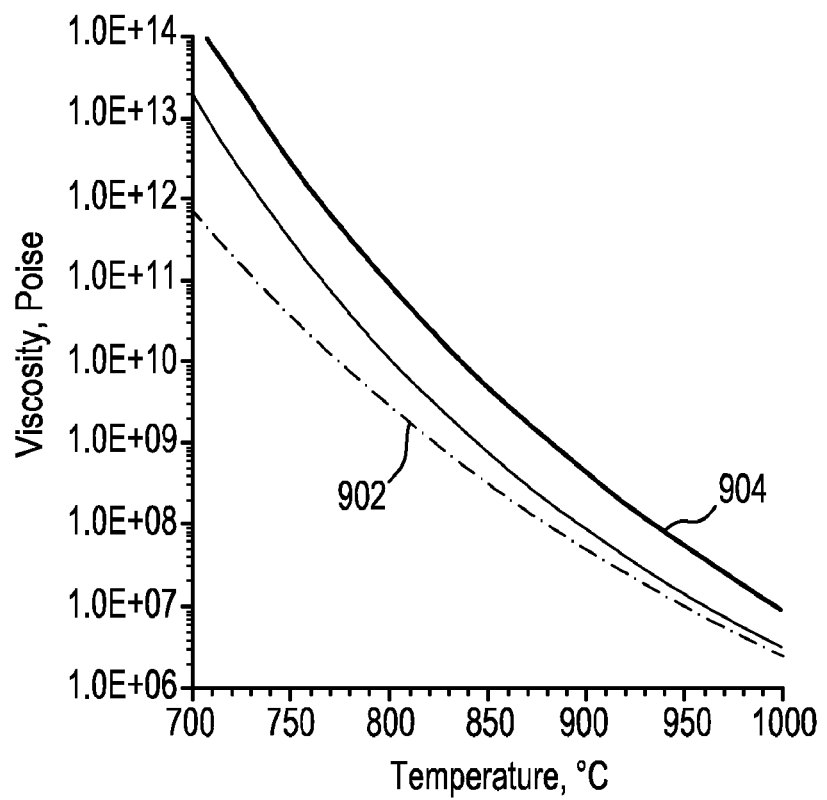
FIG. 16 is a graphical illustration of viscosity curves for exemplary glass compositions used to form shaped glass articles.

FIG. 16 is a graphical illustration of viscosity curves for the glass compositions used in Example 2. Curve 902 represents the viscosity curve of exemplary glass composition 9 used in Example 2. Curve 904 represents the viscosity curve of exemplary glass composition 8 used in Example 2.

The data shown in Table 3 and FIG. 16 illustrate that the cladding layers were at a higher viscosity than the core layer during forming of the shaped glass article according to Example 2. It was observed that the shaped glass article formed according to Example 2 did not stick to the mold. Without wishing to be bound by any theory, it is believed that the lack of sticking is a result of the relatively high viscosity of the cladding layers during forming.

Example 3

Modeling was performed to assess the effect of core to clad viscosity ratio on mold defect transfer (for example mold roughness or foreign particle) onto the surface of a glass sheet during forming of a glass article. A model was developed to simulate contacting a laminated glass sheet having the general structure shown in FIG. 1 with a forming surface of a mold to form a shaped glass article having the 3D shape shown in FIGS. 7-8. Each of the first cladding layer and the second cladding layer had a thickness of 50

µm, and the glass sheet had a total thickness of 0.7 mm. Both vacuum forming and pressure forming processes were modeled. The viscosity of the glass sheet in the bend area was lower than in the flat area (e.g., as a result of increased heating directed to the bend area), so two different viscosities were modeled. For the pressure forming model, the flat area was subjected to a higher effective pressure than the bend area (e.g., because the flat area was in contact with the forming surface during the entire forming process, while the bend area did not contact the forming surface until relatively later into the forming process). The forming surface had a protrusion with a height of 50 µm and a width of 50 µm. Both pressure forming and vacuum forming conditions for a 3 mm bend radius were modeled. Heat transfer from the glass sheet to the mold was not considered in this model. A 2D axisymmetric model in the finite-element solver POLY-FLOW was used, with isothermal viscous Newtonian flow implying glass viscosity was not changing during the process. Because glass temperature drops almost instantaneously (resulting in a corresponding increase in glass viscosity) upon contact with the colder mold, the modeled results show a worst case scenario in terms of viscosity. The model conditions are shown in Table 4.

TABLE 4

Modeled Forming Conditions

3D Forming Parameters - Glass Viscosities
Corresponding to Peak Forming Temperature

| Process Condition | Log Effective Viscosity (P) | Log Clad Viscosity (P) | Log Core Viscosity (P) | Mold Temperature (equivalent log viscosity) | Forming Pressure (bar) |
|---|---|---|---|---|---|
| Vacuum Forming - Bend | 7.54 | 8.18 | 7.18 | 9.26 | 0.8 |
| Vacuum Forming - Flat | 8.19 | 8.83 | 7.83 | 10.1 | 0.8 |
| Pressure Forming - Bend | 8.19 | 8.83 | 7.83 | 10.1 | 2 |
| Pressure Forming - Flat | 8.94 | 9.58 | 8.58 | 10.6 | 4 |

Small defect visibility on a glass surface is determined by the slope of the defect. Generally, a defect with a slope of greater than $2 \times 10^{-4}$ (1/5000) is visible by the human eye (e.g., as a result of a typical angular human eye resolution of ~1/3600). The slope of a defect is calculated by dividing the defect depth by the defect half width.

Comparative Example 2

A model was developed to simulate contacting a single-layer (non-laminated) glass sheet with a forming surface of a mold to form a shaped glass article as described in Example 3.

Figure 17:
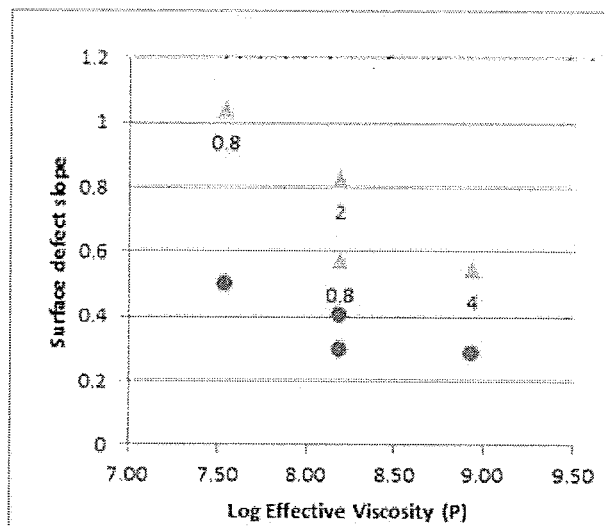
FIG. 17 is a graphical illustration of the slope of the surface defect formed in a shaped glass article as a function of the effective viscosity of the glass sheet using an exemplary modeled forming process.
Figure 18:
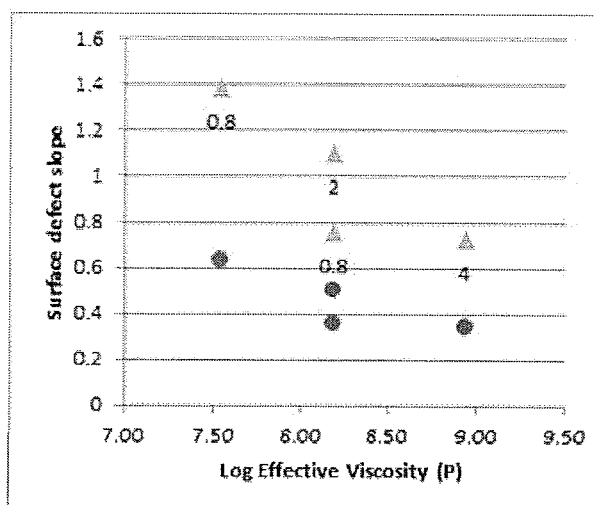
FIG. 18 is a graphical illustration of the slope of the surface defect formed in a shaped glass article as a function of the effective viscosity of the glass sheet using another exemplary modeled forming process.

FIG. 17 is a graphical illustration of the slope of the surface defect in the shaped glass article as a function of the effective viscosity of the glass sheet for the modeled forming process of Example 3 using a forming time of 15 s and a core to clad viscosity ratio of 0.1. FIG. 18 is a graphical illustration of the slope of the surface defect in the shaped glass article as a function of the effective viscosity of the glass sheet for the modeled forming process of Example 3 using a forming time of 30 s and a core to clad viscosity ratio of 0.1. The circles in FIGS. 17-18 represent the modeling results for the glass sheet as described in Example 3, and the triangles represent the modeling results for the single layer (non-laminate) glass sheet as described in Comparative Example 2 subjected to the same forming process. The data labels shown in FIGS. 17-18 represent the forming pressure in bar. As shown in FIGS. 17-18, the protrusion in the forming surface imparted a smaller defect in the laminate glass sheet compared to the single layer glass sheet. More specifically, use of the laminate glass sheet reduces the defect slope by about 50% compared to the single layer glass sheet. Also, a combination of higher forming pressure with higher glass viscosity (e.g., pressure forming with higher effective viscosity) reduces the defect slope compared to vacuum forming alone (e.g., low pressure with lower effective viscosity).

Example 4

A shaped glass article having the 3D shape shown in FIGS. 7-8 was formed by contacting a laminated glass sheet having the general structure shown in FIG. 1 with a forming surface of a mold using a process similar to that described in Example 1. Each of the first cladding layer and the second cladding layer had a thickness of about 47 µm, and the glass sheet had a total thickness of 0.55 mm. The $10^{8.2}$ P temperature of the core layer was about 57° C. below the $10^{8.2}$ P temperature of each of the first cladding layer and the second cladding layer, and the glass sheet had an effective $10^{8.2}$ P temperature of about 812° C. The shaped glass article had a compressive stress of about 190 MPa. The shaped glass article had a surface roughness ($R_a$) of 0.7 nm and a waviness of 23 nm, without being subjected to a finishing process (e.g., polishing or etching) after forming.

It will be apparent to those skilled in the art that various modifications and variations can be made without departing from the spirit or scope of the invention. Accordingly, the invention is not to be restricted except in light of the attached claims and their equivalents.

What is claimed is:
1. A shaped glass article comprising:
a first layer comprising a first glass composition comprising an alkali metal oxide selected from the group consisting of $Li_2O$, $Na_2O$, $K_2O$, and combinations thereof; and
a second layer comprising a second glass composition;

wherein a softening point of the first glass composition is less than a softening point of the second glass composition, an effective $10^{8.2}$ P temperature of the glass article is at most about 900° C., and a viscosity of the second glass composition is at least about $10^{8.3}$ P at the effective $10^{8.2}$ P temperature of the glass article, and wherein the glass article comprises at least one of a surface roughness of at most about 1 nm as measured in accordance with ASTM F2791 and a waviness of at most about 50 nm as measured in accordance with ASTM C1652/C1652M.

2. The glass article of claim 1, wherein the glass article comprises a surface roughness of at most about 1 nm as measured in accordance with ASTM F2791 and a waviness of at most about 50 nm as measured in accordance with ASTM C1652/C1652M.

3. The glass article of claim 1, wherein the first glass composition comprises a higher average coefficient of thermal expansion (CTE) than the second glass composition.

4. The glass article of claim 1, wherein the second layer comprises a compressive stress of at least about 100 MPa.

5. The glass article of claim 1, wherein the effective $10^{8.2}$ P temperature of the glass article is at most about 875° C.

6. The glass article of claim 1, further comprising at least one bend with a radius of less than about 5 mm.

7. The glass article of claim 1, wherein:
   at least one of the first glass composition or the second glass composition is ion exchangeable; or
   at least one of the first layer or the second layer is ion exchanged.

8. The glass article of claim 1, wherein the second glass composition is substantially free of alkali metal.

9. The glass article of claim 1, wherein the first layer comprises a core layer, and the second layer comprises a first cladding layer adjacent to a first major surface of the core layer and a second cladding layer adjacent to a second major surface of the core layer opposite the first major surface.

10. A display, an automotive glazing, or an architectural panel comprising the glass article of claim 1.

* * * * *

UNITED STATES PATENT AND TRADEMARK OFFICE
CERTIFICATE OF CORRECTION

PATENT NO. : 10,377,656 B2
APPLICATION NO. : 15/309068
DATED : August 13, 2019
INVENTOR(S) : Thierry Luc Alain Dannoux et al.

It is certified that error appears in the above-identified patent and that said Letters Patent is hereby corrected as shown below:

On the Title Page

On page 2, Column 1, item (57), Abstract, Line 6, delete "900° C." and insert -- 90° C. --, therefor.

Signed and Sealed this
Thirty-first Day of December, 2019

Andrei Iancu
*Director of the United States Patent and Trademark Office*